US012562130B2

(12) United States Patent
Jeon et al.

(10) Patent No.: US 12,562,130 B2
(45) Date of Patent: Feb. 24, 2026

(54) DISPLAY DEVICE

(71) Applicant: Samsung Display Co., LTD., Yongin-si (KR)

(72) Inventors: Dong Hwan Jeon, Yongin-si (KR); Won Kyu Kwak, Yongin-si (KR); Min Joo Kim, Yongin-si (KR); Min Woo Byun, Yongin-si (KR); Jong Sik Shim, Yongin-si (KR); Seon I Jeong, Yongin-si (KR); Sung Chan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/659,251

(22) Filed: May 9, 2024

(65) Prior Publication Data

US 2025/0104653 A1 Mar. 27, 2025

(30) Foreign Application Priority Data

Sep. 27, 2023 (KR) ........................ 10-2023-0131124

(51) Int. Cl.
| | |
|---|---|
| *G09G 3/3291* | (2016.01) |
| *G06F 3/041* | (2006.01) |
| *H10K 59/121* | (2023.01) |
| *H10K 59/40* | (2023.01) |

(52) U.S. Cl.
CPC ......... *G09G 3/3291* (2013.01); *G06F 3/0416* (2013.01); *H10K 59/1213* (2023.02); *H10K 59/1216* (2023.02); *H10K 59/40* (2023.02); *G06F 2203/04106* (2013.01); *G09G 2310/08* (2013.01); *G09G 2320/0233* (2013.01); *G09G 2320/041* (2013.01)

(58) Field of Classification Search
CPC ................ G06F 3/0446; G06F 3/0416; G06F 2203/04106; G09G 3/3291; G09G 2310/08; G09G 2320/0233; G09G 2320/041; G09G 3/3233; G09G 2300/0426; G09G 2300/42; G09G 3/3275; H10K 59/1213; H10K 59/1216; H10K 59/40
USPC .................................................. 345/204, 206
See application file for complete search history.

(56) References Cited

U.S. PATENT DOCUMENTS

| | | | |
|---|---|---|---|
| 8,345,069 B2 * | 1/2013 | Minami ............... | G09G 3/3233 345/690 |
| 11,508,309 B2 | 11/2022 | Lin et al. | |
| 2009/0201231 A1 * | 8/2009 | Takahara ............. | G09G 3/3233 345/76 |
| 2015/0187276 A1 * | 7/2015 | Shim ..................... | G09G 3/3291 345/77 |
| 2021/0090513 A1 * | 3/2021 | Takahashi ............ | G09G 3/3659 |

(Continued)

FOREIGN PATENT DOCUMENTS

WO WO-2022125260 A1 * 6/2022 .......... G09G 3/3233

*Primary Examiner* — Julie Anne Watko
(74) *Attorney, Agent, or Firm* — Sughrue Mion, PLLC

(57) ABSTRACT

A display device includes a plurality of pixels arranged in a display area of a display panel, and a display driving circuit supplying data voltages and pixel driving control signals to the plurality of pixels to control an image display operation for each of the plurality of pixels. The display driving circuit further supplies an active control voltage that varies proportional to or inversely proportional to a change in temperature of the display panel to at least one thin film transistor included in the plurality of pixels.

15 Claims, 14 Drawing Sheets

(56) References Cited

U.S. PATENT DOCUMENTS

| | | | |
|---|---|---|---|
| 2023/0225160 A1* | 7/2023 | Cho | H10D 86/441 |
| | | | 345/694 |
| 2023/0419896 A1* | 12/2023 | Zhang | H10K 59/1213 |
| 2024/0381693 A1* | 11/2024 | Tsubuku | G09F 9/30 |

* cited by examiner (N-type T2)

(P-type T2)

NDA2

DA2

NFA2

10

DISPLAY DEVICE

CROSS-REFERENCE TO RELATED APPLICATION(S)

This application claims priority to and benefits of Korean Patent Application No. 10-2023-0131124 under 35 U.S.C. 119, filed on Sep. 27, 2023, in the Korean Intellectual Property Office (KIPO), the entire contents of which are incorporated herein by reference.

BACKGROUND

1. Technical Field

The disclosure relates to a display device.

2. Description of the Related Art

As an information society develops, the demand for a display device for displaying an image is increasing in various forms. For example, display devices are applied to various electronic devices such as smartphones, digital cameras, laptop computers, navigation devices, and smart televisions.

The display device may be a flat panel display device such as a liquid crystal display device, a field emission display device, or an organic light emitting display device. Among the flat panel display devices, the light emitting display device may include a light emitting element in which each of the pixels of a display panel may emit light by itself, thereby displaying an image without a backlight unit providing the light to the display panel.

In the light emitting display device, differences in characteristics such as threshold voltage and mobility of switching elements (e.g., thin film transistors) occur for each image display pixel depending on temperature changes in the usage environment. Accordingly, a high-potential voltage drop occurs for each image display pixel, and as a result, the amount of current driving the light emitting element varies, resulting in luminance deviation between the image display pixels.

SUMMARY

Aspects of the disclosure provide a display device capable of reducing luminance deviation of image display pixels by minimizing an influence of changes in usage temperature.

Aspects of the disclosure also provide a display device capable of maintaining image display quality by adjusting a voltage or current amount of a switching element (e.g., thin film transistor) for each image display pixel according to changes in usage temperature.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a plurality of pixels arranged in a display area of a display panel, and a display driving circuit supplying data voltages and pixel driving control signals to the plurality of pixels to control an image display operation for each of the plurality of pixels. The display driving circuit may further supply an active control voltage that varies proportional to or inversely proportional to a change in temperature of the display panel to at least one thin film transistor included in the plurality of pixels.

In an embodiment, the plurality of pixels may include a light emitting element and a pixel circuit that controls an amount of light emitted from the light emitting element, and the pixel circuit includes a plurality of thin film transistors and at least one capacitor. At least one of the plurality of thin film transistors may include a gate electrode, a first active layer patterned by covering the gate electrode with a first planar size, a source electrode formed on a side of the first active layer and covering the gate electrode and a partial area of the first active layer overlapping the gate electrode in a thickness direction of the display panel, and a drain electrode formed on another side of the first active layer opposite to the source electrode and covering the gate electrode and another partial area of the first active layer overlapping the gate electrode in the thickness direction.

In an embodiment, at least another one of the plurality of thin film transistors may include a gate electrode, a second active layer patterned by covering the gate electrode with a second planar size, a source electrode formed on a side of the second active layer and covering the gate electrode and a partial area of the second active layer overlapping the gate electrode in the thickness direction, and a drain electrode formed on another side of the second active layer opposite to the source electrode and covering the gate electrode and another partial area of the second active layer overlapping the gate electrode in the thickness direction.

In an embodiment, a first planar area of the first active layer may be greater than a second planar area of the second active layer in a plan view.

In an embodiment, a height or thickness of the first active layer may be greater than a height or thickness of the second active layer.

In an embodiment, a width of the first active layer in at least one direction may be greater than a width of the second active layer in the at least one direction.

In an embodiment, the at least one of the plurality of thin film transistors may be formed in a diode structure or a self-bias structure in which the first active layer and the drain electrode or the source electrode are electrically connected, or the gate electrode is electrically connected to the drain electrode or the source electrode.

In an embodiment, the at least one of the plurality of thin film transistors may be supplied with the active control voltage from the display driving circuit in units of a period, as the first active layer is electrically connected to the display driving circuit through each voltage control line.

In an embodiment, the display driving circuit may vary a voltage level of the active control voltage to be inversely proportional to a change in magnitude of temperature of the display panel or external temperature, and supply the active control voltage, whose voltage level is varied, to the first active layer of the at least one of the plurality of thin film transistors through the voltage control line.

In an embodiment, the display driving circuit may vary a voltage level of the active control voltage to be proportional to a change in magnitude of temperature of the display panel or external temperature, and supply the active control voltage, whose voltage level is varied, to the first active layer of the at least one of the plurality of thin film transistors through the voltage control line.

According to an embodiment of the disclosure, a display device may include a plurality of pixels arranged in a display area of a display panel, a touch sensing part mounted on a front portion of the display panel or formed integrally with the display panel, a touch driving circuit sensing a touch of a human body or a touch pen using a plurality of touch electrodes arranged in the touch sensing part, and a display driving circuit supplying data voltages and pixel driving control signals to the plurality of pixels to control an image display operation for each of the plurality of pixels. The display driving circuit may further supply an active control voltage that varies proportional or inversely proportional to a change in temperature of the display panel to at least one thin film transistor included in the plurality of pixels.

In an embodiment, the plurality of pixels may include a light emitting element and a pixel circuit that controls an amount of light emitted from the light emitting element, and the pixel circuit may include a plurality of thin film transistors and at least one capacitor. At least one of the plurality of thin film transistors may include a gate electrode, a first active layer patterned by covering the gate electrode with a first planar size, a source electrode formed on a side of the first active layer and covering the gate electrode and a partial area of the first active layer overlapping the gate electrode in a thickness direction of the display panel, and a drain electrode formed on another side of the first active layer opposite to the source electrode and covering the gate electrode and another partial area of the first active layer overlapping the gate electrode in the thickness direction.

In an embodiment, at least another one of the plurality of thin film transistors may include a gate electrode, a second active layer patterned by covering the gate electrode with a second planar size, a source electrode formed on a side of the second active layer and covering the gate electrode and a partial area of the second active layer overlapping the gate electrode in the thickness direction, and a drain electrode formed on another side of the second active layer opposite to the source electrode and covering the gate electrode and another partial area of the second active layer overlapping the gate electrode in the thickness direction.

In an embodiment, a first planar area of the first active layer may be greater than a second planar area of the second active layer in a plan view, or a height or thickness of the first active layer may be greater than a height or thickness of the second active layer, or a width of the first active layer in at least one direction may be greater than a width of the second active layer in the at least one direction.

In an embodiment, the at least one of the plurality of thin film transistors may be formed in a diode structure or a self-bias structure in which the first active layer and the drain electrode or the source electrode are electrically connected, or the gate electrode is electrically connected to the drain electrode or the source electrode.

In an embodiment, the at least one of the plurality of thin film transistors may be supplied with the active control voltage from the display driving circuit in units of a period, as the first active layer is electrically connected to the display driving circuit through each voltage control line.

In an embodiment, the display driving circuit may vary a voltage level of the active control voltage to be proportional to or inversely proportional to a change in magnitude of temperature of the display panel or external temperature, and supply the active control voltage, whose voltage level is varied, to the first active layer of the at least one of the plurality of thin film transistors through the voltage control line.

According to the display device according to an embodiment of the disclosure, the luminance deviation of the image display pixels may be reduced by improving the size and electrode connection structure of the switching element for each image display pixel to minimize the influence of changes in touch usage temperature.

Further, the display device according to an embodiment may maintain or further improve the image display quality by adjusting the amount of voltage or current supplied to the switching element of the image display pixel according to changes in usage temperature.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
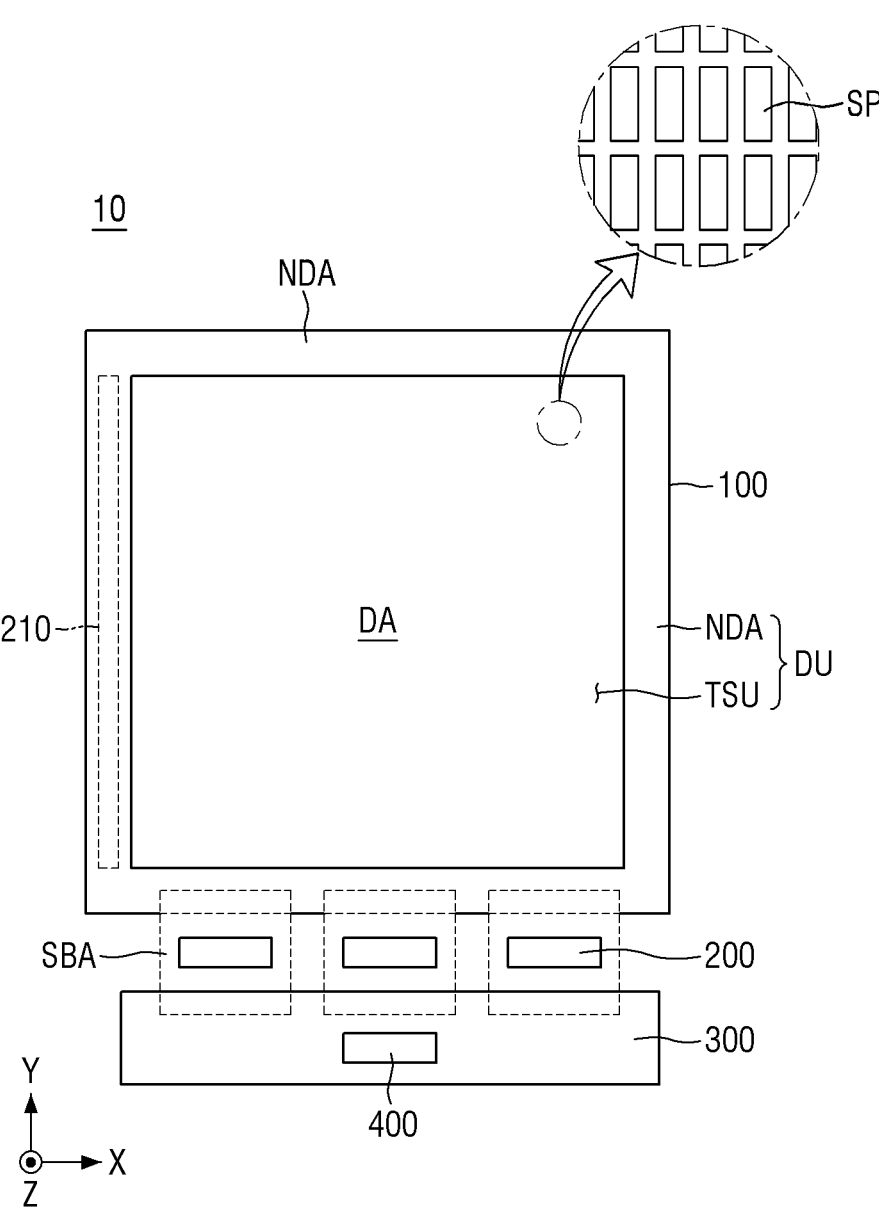
FIG. 1 is a plan view illustrating a configuration of a display device according to an embodiment of the disclosure.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will fully convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

Figure 2:
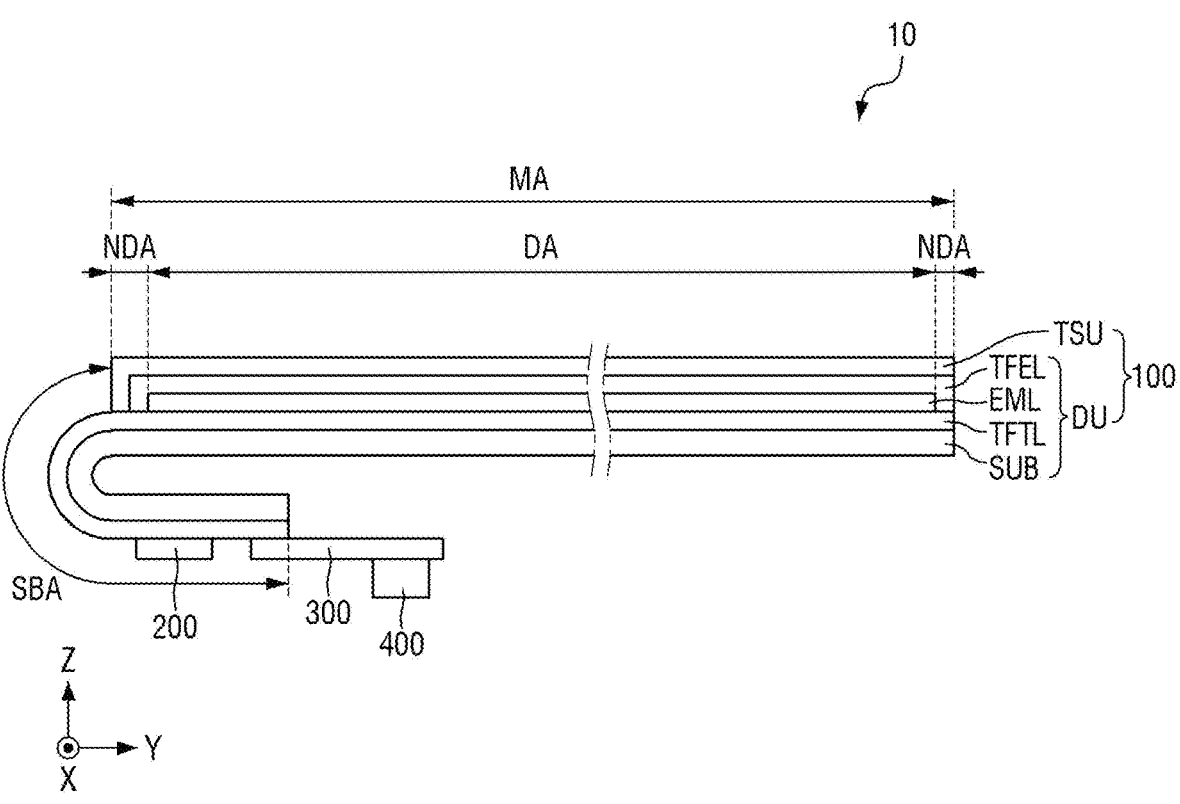
FIG. 2 is a schematic cross-sectional view of the display device of FIG. 1.

FIG. 1 is a plan view illustrating a configuration of a display device according to an embodiment of the disclosure. FIG. 2 is a schematic cross-sectional view of the display device of FIG. 1.

Referring to FIGS. 1 and 2, a display device 10 according to an embodiment may be applied to portable electronic devices such as tablet personal computer (PC), portable multimedia player (PMP), navigation, ultra mobile PC (UMPC), e-book, e-notebook, mobile phone, smart phone, mobile communication terminal, etc. For example, the display device 10 may be applied to a display unit of a television, a laptop computer, a monitor, a billboard, or the Internet of Things (IoT).

The display device 10 according to an embodiment may be variously classified according to a display method. For example, the display device 10 may be classified into and include an organic light emitting diode display (OLED), an inorganic light emitting display (EL), a quantum dot light emitting display (QED), a micro-LED display, a nano-LED display, a plasma display panel (PDP), a field emission display (FED), a liquid crystal display (LCD), an electrophoretic display (EPD), etc. Hereinafter, an organic light emitting diode display (OLED) will be described as an embodiment of the display device 10, and unless a special distinction is required, the organic light emitting diode display (OLED) applied to the embodiment will be abbreviated as the display device 10. However, the display device 10 is not limited to the organic light emitting diode display (OLED), and other display devices listed above may be applied within the scope of sharing technical spirits.

The display device 10 according to an embodiment may have a rectangular shape, a square shape, a circular shape, an elliptical shape, or a quadrate shape in a plan view. For example, in case that the display device 10 is a mobile device such as a tablet PC, the display device 10 may have a rectangular shape with a long side positioned in a horizontal direction. However, the disclosure is not limited thereto, and the long side of the display device 10 may be positioned in a vertical direction, and the display device 10 may be rotatably installed, such that the long side of the display device 10 may also be variably positioned in the horizontal or vertical direction.

The display device 10 may include a display panel 100, a display driving circuit 200, a touch sensing module including a touch sensing unit (or touch sensing part) TSU, and a touch driving circuit 400.

For example, the display panel 100 of the display device 10 may include a display unit DU for displaying an image, and the touch sensing unit TSU for sensing a touch of a body portion such as a finger and an electronic pen may be disposed on the display panel 100. Multiple pixels SP may be formed in an arrangement in the display unit DU of the display panel 100, and an image may be displayed by the pixels SP.

The touch sensing unit TSU may be mounted on a front surface of the display panel 100 or formed integrally with the display panel 100. The touch sensing unit TSU may include multiple touch electrodes to sense a user's touch in a capacitive manner using the touch electrodes.

The display driving circuit 200 may output data voltages and pixel driving control signals for driving the pixels SP arranged in the display unit DU. The display driving circuit 200 may supply data voltages to data lines to which the pixels SP are connected. The display driving circuit 200 may supply a power voltage to a power line, supply gate control signals to a gate driver 210, and supply the pixel driving control signals to the pixels SP.

The display driving circuit 200 may supply an active control voltage that varies to be proportional or inversely proportional to a change in temperature of the display panel 100 to at least one thin film transistor included in the pixels SP.

Characteristics such as threshold voltage and mobility of thin film transistors included in each pixel SP may vary depending on changes in the temperature of the display panel 100 or external temperature. For example, the characteristics such as threshold voltage and mobility of transistors may increase or decrease in proportion to changes in the temperature of the display panel 100. The amount of current driving the light emitting element for each pixel SP may vary, and a luminance deviation may occur accordingly. In order to minimize an influence of changes in the temperature of the display panel 100, the display driving circuit 200 may supply an active control voltage that varies to be proportional or inversely proportional to the change in the temperature of the display panel 100 to at least one thin film transistor included in each pixel SP.

The touch driving circuit 400 may be electrically connected to the touch sensing unit TSU. The touch driving circuit 400 may supply touch driving signals to the touch electrodes arranged in the touch sensing unit TSU, and may sense an amount of change in capacitance between the touch electrodes. The touch driving circuit 400 may calculate whether a user's touch input is made and touch coordinates based on the amount of change in capacitance between the touch electrodes.

The display driving circuit 200 may operate as a main processor or may be formed integrally with a main processor. Accordingly, the display driving circuit 200 may control the overall function of the display device 10. For example, the display driving circuit 200 may receive touch data from the touch driving circuit 400, determine user's touch coordinates, and generate digital video data according to the touch coordinates. The display driving circuit 200 may execute an application indicated by an icon displayed on the user's touch coordinates. For example, the display driving circuit 200 may receive coordinate data from an electronic pen or the like, determine touch coordinates of the electronic pen, and generate digital data according to the touch coordinates, or also execute an application indicated by an icon displayed on the touch coordinates of the electronic pen.

Referring to FIG. 2, the display panel 100 may be divided into a main area MA and a sub-area SBA. The main area MA may include a display area DA having pixels SP displaying an image, and a non-display area NDA disposed adjacent to the display area DA. In the display area DA, light may be emitted from light emitting areas or opening areas of each pixel SP to display an image. To this end, the pixels SP of the display area DA may include a pixel circuit including switching elements (e.g., thin film transistors), a pixel defining film defining the light emitting area or the opening area, and a self-light emitting element.

The non-display area NDA may be an area outside the display area DA. The non-display area NDA may be defined as an edge area of the main area MA of the display panel 100. The non-display area NDA may include a gate driver (not illustrated) supplying gate signals to the gate lines, and fan-out lines (not illustrated) connecting the display driving circuit 200 and the display area DA.

The sub-area SBA may extend from a side of the main area MA. The sub-area SBA may include a flexible material that may be bent, folded, rolled, or the like. For example, in case that the sub-area SBA is bent, the sub-area SBA may overlap the main area MA in the thickness direction (Z-axis direction). The sub-area SBA may include the display driving circuit 200 and a pad portion connected to the circuit board 300. In another embodiment, the sub-area SBA may be omitted, and the display driving circuit 200 and the pad portion may be disposed in the non-display area NDA.

At least one display driving circuit 200 may be formed as an integrated circuit (IC) and mounted on the display panel 100 by a chip on glass (COG) method, a chip on plastic (COP) method, or an ultrasonic bonding method. For example, the display driving circuit 200 may be disposed in a sub-area SBA, and may overlap the main area MA in the thickness direction (Z-axis direction) by bending of the sub-area SBA. In another embodiment, the display driving circuit 200 may be mounted on the circuit board 300.

The circuit board 300 may be electrically connected to the pad portion of the display panel 100 by an anisotropic conductive film (ACF). To this end, lead lines of the circuit board 300 may be electrically connected to the pad portion of the display panel 100. The circuit board 300 may be a flexible film such as a flexible printed circuit board, a printed circuit board, or a chip on film.

The substrate SUB of the display panel 100 may be a base substrate or a base member. The substrate SUB may be a flexible substrate that may be bent, folded, rolled, or the like. For example, the substrate SUB may include a glass material or a metal material, but the disclosure is not limited thereto. In another embodiment, the substrate SUB may include a polymer resin including polyimide (PI).

A thin film transistor layer TFTL may be disposed on the substrate SUB. The thin film transistor layer TFTL may include multiple thin film transistors constituting the pixel circuit of the pixels SP. The thin film transistor layer TFTL may further include gate lines, data lines, power lines, gate control lines, fan-out lines connecting the display driving circuit 200 and the data lines, and lead lines connecting the display driving circuit 200 and the pad portion. In case that the gate driver 210 is formed on a side of the non-display area NDA of the display panel 100, the gate driver 210 may also include the thin film transistors.

The thin film transistor layer TFTL may be disposed in the display area DA, the non-display area NDA, and the sub-area SBA. The thin film transistors, the gate lines, the data lines, and the power lines of each of the pixels of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

A light emitting element layer EML may be disposed on the thin film transistor layer TFTL. The light emitting element layer EML may include multiple light emitting elements in which a first electrode, a light emitting layer, and a second electrode are sequentially stacked to emit light, and a pixel defining film defining pixels. The light emitting elements of the light emitting element layer EML may be disposed in the display area DA.

An encapsulation layer TFEL may cover an upper surface and side surfaces of the light emitting element layer EML, and may protect the light emitting element layer EML. The encapsulation layer TFEL may include at least one inorganic film and at least one organic film for encapsulating the light emitting element layer EML.

A touch sensing unit TSU may be disposed on the encapsulation layer TFEL. The touch sensing unit TSU may include multiple touch electrodes for sensing a user's touch in a capacitance type, and touch lines connecting the touch electrodes and the touch driving circuit 400. For example, the touch sensing unit TSU may sense a user's touch in a self-capacitance method or a mutual capacitance method.

In another embodiment, the touch sensing unit TSU may be disposed on a separate substrate disposed on the display unit DU, and the substrate supporting the touch sensing unit TSU may be a base member that encapsulates the display unit DU.

The touch electrodes included in the touch sensing unit TSU may be disposed in a touch sensing area overlapping the display area DA in the thickness direction. The touch lines of the touch sensing unit TSU may be disposed in a touch peripheral area overlapping the non-display area NDA in the thickness direction.

The touch driving circuit 400 may be disposed on a separate circuit board 300. The touch driving circuit 400 may be formed as an integrated circuit (IC). As described above, the touch driving circuit 400 may apply the touch driving signals to the touch electrodes of the touch sensing unit TSU. The touch driving circuit 400 may measure an amount of change in charge of a mutual capacitance of each of the touch nodes formed at intersection areas of the touch electrodes. For example, the touch driving circuit 400 may measure a change in capacitance of the touch nodes according to a change in the magnitude of a voltage or an amount of current of a touch sensing signal received through the touch electrodes. In this way, the touch driving circuit 400 may determine whether or not a user's touch is made, whether or not a user's approach is made, and the like, according to the amount of change in charge of the mutual capacitance of each of the touch nodes. The touch driving signal may be a pulse signal having a frequency. The touch driving circuit 400 may calculate whether a touch input of a user's body part, such as a finger is made and touch coordinates based on the amount of change in capacitance between the touch electrodes.

For example, the touch driving circuit 400 may detect whether the user's touch is made by sequentially supplying the touch driving signals to the touch electrodes arranged across each other in the touch sensing unit TSU, and sequentially measuring the amount of change in charge of the capacitance of each of the touch nodes formed by intersection of the touch electrodes.

Figure 3:
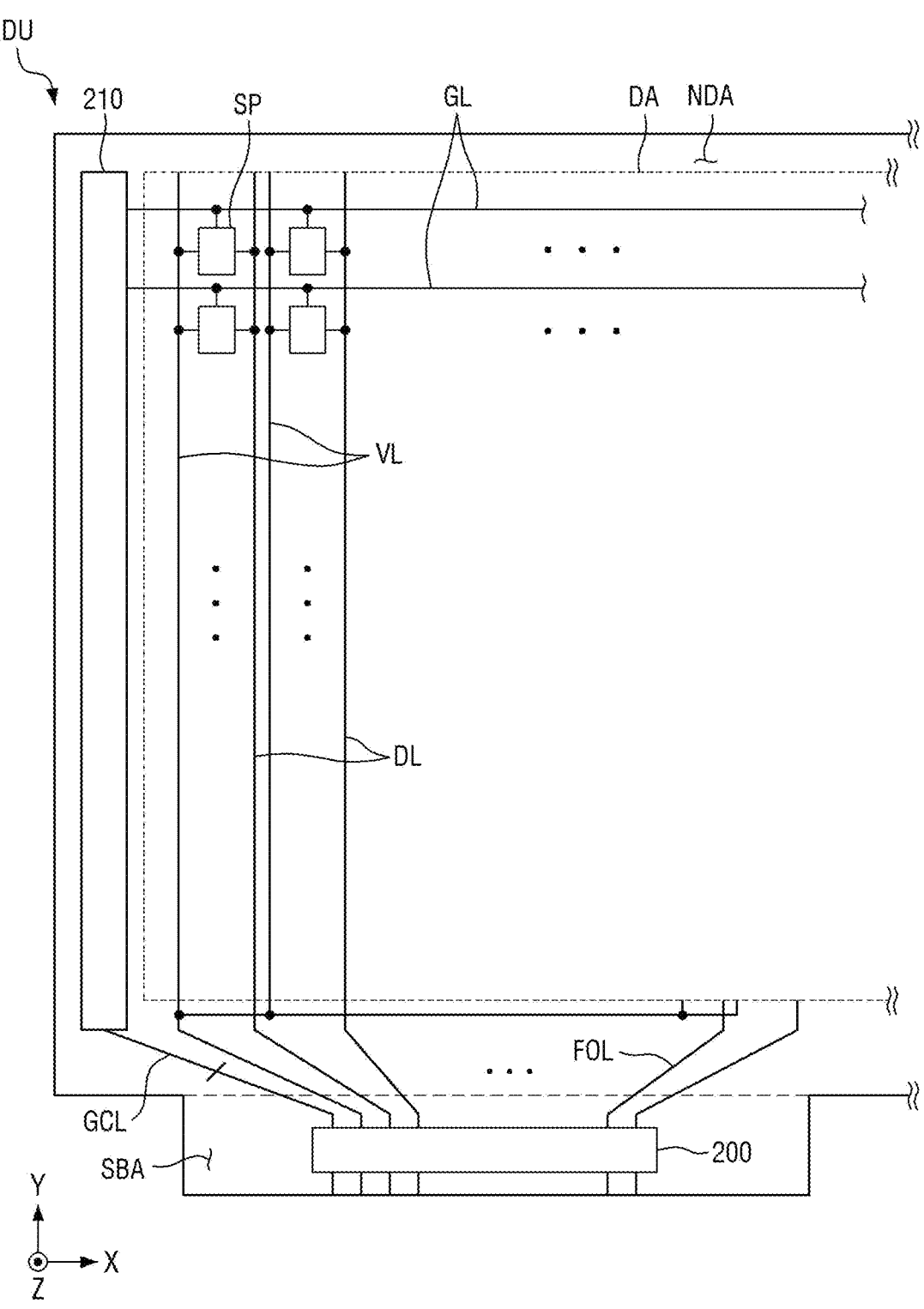
FIG. 3 is a plan view schematically illustrating a layout of a display panel according to an embodiment.

FIG. 3 is a plan view schematically illustrating a layout of a display panel according to an embodiment. Specifically, FIG. 3 is a layout view illustrating a display area DA and a non-display area NDA of the display unit DU before the touch sensing unit TSU is formed.

The display area DA, which is an area displaying an image, may be defined as a central area of the display panel 100. The display area DA may include multiple pixels SP, multiple gate lines GL, multiple data lines DL, and multiple power lines VL. Each of the pixels SP may be defined as a minimum unit for outputting light.

The gate lines GL may supply the scan signals or the gate signals received from the gate driver 210 to the pixels SP. The gate lines GL may extend in the X-axis direction and may be spaced apart from each other in the Y-axis direction intersecting the X-axis direction.

The data lines DL may supply the data voltage received from the display driving circuit 200 to the pixels SP. The data lines DL may extend in the Y-axis direction and may be spaced apart from each other in the X-axis direction.

Multiple control lines, such as multiple light emission control lines and initialization lines, may be formed in the display area DA to supply pixel driving control signals, such as emission control signals or initialization signals, received from the display driving circuit 200 to the pixels SP. In the display area DA, the control lines may extend in the Y-axis direction and may be spaced apart from each other in the X-axis direction.

The power lines VL may supply high-potential and low-potential power voltages received from the display driving circuit 200 to the pixels SP. The power voltage may be at least one of a high-potential and low-potential driving voltage, an initialization voltage, and a reference voltage. The power lines VL may extend in the Y-axis direction and may be spaced apart from each other in the X-axis direction.

The non-display area NDA may surround the display area DA. The non-display area NDA may include a gate driver 210, fan-out lines FOL, and gate control lines GCL. The gate driver 210 may generate multiple gate signals based on the gate control signals, and may sequentially supply the gate signals to the gate lines GL according to a set order.

The fan-out lines FOL may extend from the display driving circuit 200 to the display area DA. The fan-out lines FOL may supply the data voltage received from the display driving circuit 200 to the data lines DL.

The gate control line GCL may extend from the display driving circuit 200 to the gate driver 210. The gate control line GCL may supply the gate control signal received from the display driving circuit 200 to the gate driver 210.

The display driving circuit 200 may supply the data voltage to the data lines DL through the fan-out lines FOL. The data voltage may be supplied to the pixels SP and may determine luminance of the pixels SP. The display driving circuit 200 may supply the gate control signals to the gate driver 210 through the gate control line GCL. The display driving circuit 200 may supply the pixel driving control signals to each control line through separate fan-out lines connected to the control lines of the display area DA.

Figure 4:
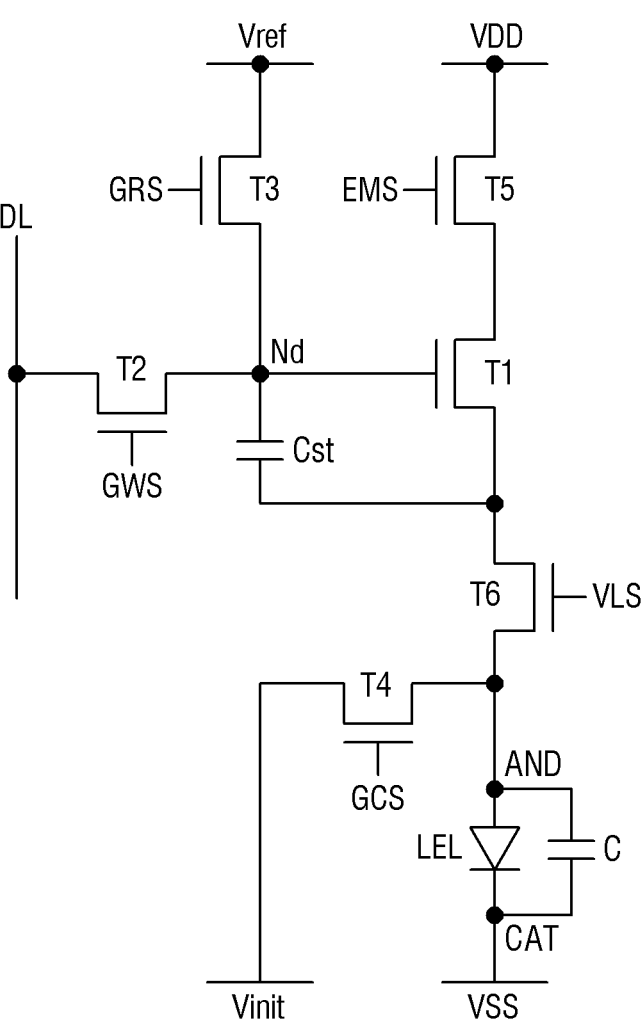
FIG. 4 is a schematic diagram of an equivalent circuit of a pixel of the display panel illustrated in FIG. 3 according to an embodiment.

FIG. 4 is a schematic diagram of an equivalent circuit of a pixel of the display panel illustrated in FIG. 3 according to an embodiment.

Referring to FIG. 4, each pixel SP arranged in the display area DA may be constituted as a 6T (Transistor) 2C (Capacitor) type including first to sixth thin film transistors T1 to T6, a light emitting element LEL, and first and second capacitors Cst and C. In the 6T2C type pixel circuit, the first thin film transistor may serve as a driving transistor that drives the light emitting element LEL. In another embodiment, each pixel SP may be formed as a 7T2C type including first to sixth thin film transistors T1 to T6, a separate driving transistor, a light emitting element LEL, and first and second capacitors Cst and C. As an embodiment, a structure of the 6T2C type pixel SP will be described below.

The 6T2C type pixel SP illustrated in FIG. 4 may be connected to a first scan line to which a first scan signal GWS is supplied, a second scan line to which a second scan signal GRS is supplied, an initialization line to which an initialization signal GCS is supplied, an enable line to which an enable signal EMS is supplied, and an emission control line to which an emission control signal VLS is supplied.

Each pixel SP may be connected to a first driving voltage line to which a first driving voltage VDD is supplied, an initialization voltage line to which an initialization voltage Vinit is supplied, a reference voltage line to which a reference voltage Vref is supplied, and a second driving voltage line to which a second driving voltage VSS is supplied.

The first thin film transistor T1 may function as a driving transistor that drives the light emitting element LEL. The first thin film transistor T1 may control a drain-source current (Ids, hereinafter referred to as "driving current") flowing between a first electrode and a second electrode according to the data voltage applied to a gate electrode from the second thin film transistor T2. The driving current Ids flowing through a channel of the first thin film transistor T1 may be proportional to a square of a difference between a gate-source voltage Vsg of the first thin film transistor T1 and a threshold voltage thereof as expressed in Equation 1.

$$Ids = k' \times (Vgs - Vth)^2 \qquad \text{[Equation 1]}$$

In Equation 1, k' may be a proportionality coefficient determined by the structure and physical characteristics of the first thin film transistor T1, Vsg may be a source-gate voltage of the first thin film transistor T1, and Vth may be a threshold voltage of the first thin film transistor T1.

The light emitting element LEL may emit light according to the driving current Ids input from the first thin film transistor T1. An amount of light emitted from the light emitting element LEL may be proportional to the driving current Ids.

The light emitting element LEL may be an organic light emitting diode including an anode electrode AND, a cathode electrode CAT, and an organic light emitting layer disposed between the anode electrode AND and the cathode electrode CAT. In another embodiment, the light emitting element LEL may be an inorganic light emitting element including an anode electrode AND, a cathode electrode CAT, and an inorganic semiconductor disposed between the anode electrode AND and the cathode electrode CAT. In another embodiment, the light emitting element LEL may be a quantum dot light emitting element including an anode electrode AND, a cathode electrode CAT, and a quantum dot light emitting layer disposed between the anode electrode AND and the cathode electrode. In another embodiment, the light emitting element LEL may be a micro light emitting diode.

The anode electrode AND of the light emitting element LEL may be connected to a first electrode of the fourth thin film transistor T4 and a second electrode of the sixth thin film transistor T6, and the cathode electrode CAT of the light emitting element LEL may be connected to a second driving voltage VSS line. A second capacitor C of parasitic capacitance may be formed between the anode electrode AND and the cathode electrode CAT of the light emitting element LEL.

The second thin film transistor T2 may be turned on by the first scan signal GWS of the first scan line and may connect a gate electrode of the first thin film transistor T1 and the data line DL.

A gate electrode of the second thin film transistor T2 may be connected to the first scan line, a first electrode of the second thin film transistor T2 may be connected to a gate electrode of a first thin film transistor T1, and a second electrode of the second thin film transistor T2 may be connected to the data line DL. Accordingly, a first contact node Nd may be formed at a connection portion between the first electrode of the second thin film transistor T2 and the gate electrode of the first thin film transistor T1.

The third thin film transistor T3 may be turned on by the second scan signal GRS of the second scan line and connect the gate electrode of the first thin film transistor T1 and the reference voltage line. A gate electrode of the third thin film transistor T3 may be connected to the second scan line, a first electrode of the third thin film transistor T3 may be connected to the gate electrode of the first thin film transistor T1, and a second electrode of the third thin film transistor T3 may be connected to the reference voltage line. The first contact node Nd and the gate electrode of the first thin film transistor T1 may be dropped to the reference voltage Vref of the reference voltage line by the turn-on operation of the third thin film transistor T3 according to the second scan signal GRS.

The fourth thin film transistor T4 may be turned on by the initialization signal GCS of the initialization line and connect the anode electrode AND of the light emitting element LEL and the initialization voltage line. A gate electrode of the fourth thin film transistor T4 may be connected to the initialization line, a first electrode of the fourth thin film transistor T4 may be connected to the anode electrode AND of the light emitting element LEL, and a second electrode of the fourth thin film transistor T4 may be connected to the initialization voltage line. The anode electrode AND of the light emitting element LEL may be discharged to the initialization voltage Vinit by the turn-on operation of the fourth thin film transistor T4 according to the initialization signal GCS.

The fifth thin film transistor T5 may be turned on by the enable signal EMS of the enable control line and connect the first electrode of the first thin film transistor T1 and the first driving voltage line. A gate electrode of the fifth thin film transistor T5 may be connected to the enable control line, a first electrode of the fifth thin film transistor T5 may be connected to the first driving voltage line, and a second electrode of the fifth thin film transistor T5 may be connected to the first electrode of the first thin film transistor T1. The first driving voltage VDD may be supplied to the first electrode of the first thin film transistor T1 by the turn-on operation of the fifth thin film transistor T5 according to the enable signal EMS.

The sixth thin film transistor T6 may be connected between the second electrode of the first thin film transistor T1 and the anode electrode AND of the light emitting element LEL. The sixth thin film transistor T6 may be turned on by the emission control signal VLS of the emission control line and connect the second electrode of the first thin film transistor T1 and the anode electrode AND of the light emitting element LEL. A gate electrode of the sixth thin film transistor T6 may be connected to the emission control line, a first electrode of the sixth thin film transistor T6 may be connected to the second electrode of the first thin film transistor T1, and a second electrode of the sixth thin film transistor T6 may be connected to the anode electrode AND of the light emitting element LEL. In case that both the fifth thin film transistor T5 and the sixth thin film transistor T6 are turned on, the driving current Ids may be supplied to the light emitting element LEL.

The first capacitor Cst may be formed between the gate electrode of the first thin film transistor T1 and the second electrode of the first thin film transistor T1. In another embodiment, the first capacitor Cst may be formed between the gate electrode of the first thin film transistor T1 and the first driving voltage line.

In case that the first electrode of each of the first to sixth thin film transistors T1, T2, T3, T4, T5, and T6 is a source electrode, the second electrode may be a drain electrode. In another embodiment, in case that the first electrode of each of the first to sixth thin film transistors T1, T2, T3, T4, T5, and T6 is a drain electrode, the second electrode may be a source electrode.

An active layer of each of the first to sixth thin film transistors T1, T2, T3, T4, T5, and T6 may also be formed of at least one of polysilicon, amorphous silicon, and an oxide semiconductor. It is described in FIG. 4 that the first to sixth thin film transistors T1, T2, T3, T4, T5, and T6 are formed as N-type MOSFETs, but the disclosure is not limited thereto. In another embodiment, the first to sixth thin film transistors T1, T2, T3, T4, T5, and T6 may be formed as P-type MOSFETs.

The potential of the first driving voltage VDD of the first driving voltage line, the second driving voltage VSS of the second driving voltage line, the reference voltage Vref of the reference voltage line, and the initialization voltage Vinit of the initialization voltage line may be differently set, taking into account characteristics of the first thin film transistor T1, characteristics of the light emitting element LEL, etc. For example, a voltage difference between the initialization voltage Vinit and the data voltage supplied to the source electrode of the first thin film transistor T1 may be set to be smaller than the threshold voltage of the first thin film transistor T1.

Figure 5:
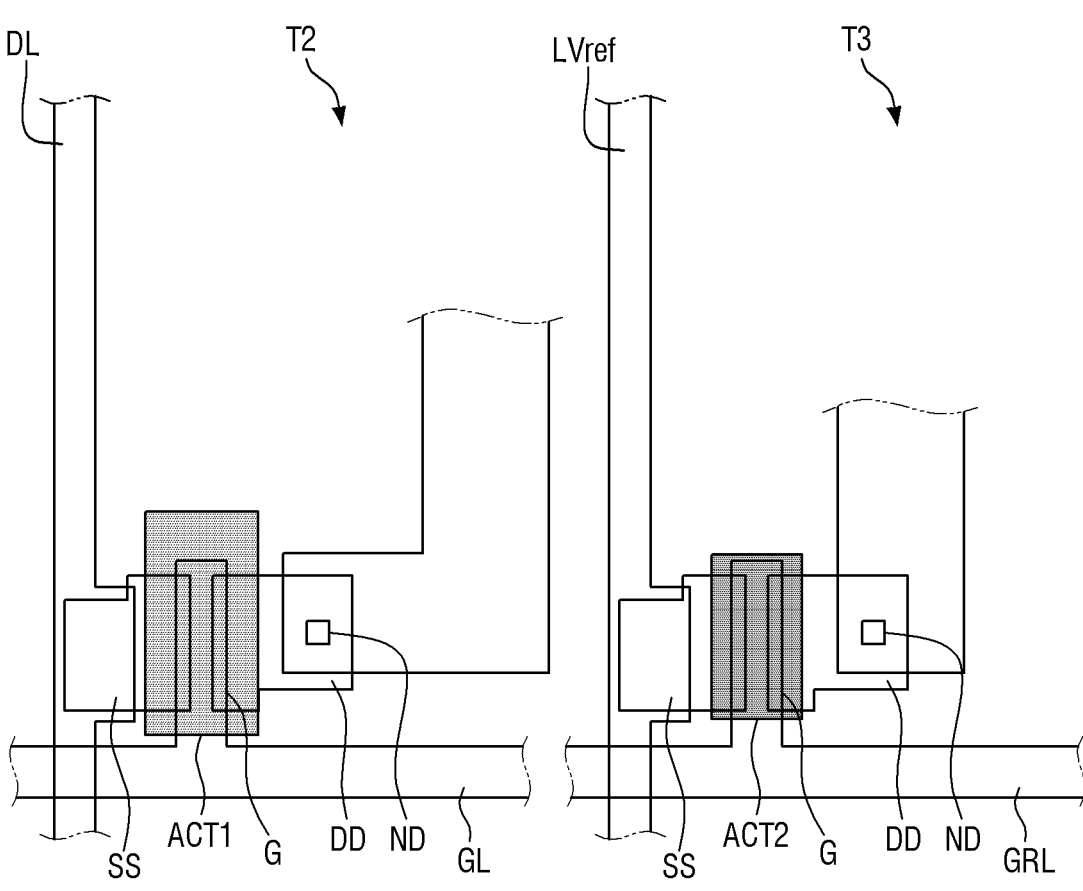
FIG. 5 is a layout view illustrating an arrangement of second and third thin film transistors illustrated in FIG. 4.

FIG. 5 is a layout view illustrating an arrangement of second and third thin film transistors illustrated in FIG. 4.

Referring to FIG. 5, at least one thin film transistor T2 among the first to sixth thin film transistors T1, T2, T3, T4, T5, and T6 may include a gate electrode G, a first active layer ACT1 patterned by covering the gate electrode G with a first planar size, a source electrode SS formed to cover the gate electrode G and a partial area of the first active layer ACT1 overlapping the gate electrode G, and a drain electrode DD formed in a direction opposite to the source electrode SS to cover the gate electrode G and a partial area of the first active layer ACT1 overlapping the gate electrode G.

For example, the first active layer ACT1 of the second thin film transistor T2 may be formed to cover the gate electrode G extending from the gate line GL with a first planar size. The source electrode SS of the second thin film transistor T2 may be formed so that a side thereof is electrically connected to the data line DL, and another side thereof covers a portion of the first active layer ACT1 overlapping the gate electrode G. Accordingly, the drain electrode DD of the second thin film transistor T2 may be formed so that a side covers the gate electrode G and a partial area of the first active layer ACT1 overlapping the gate electrode G, and another side is electrically connected to the first contact node Nd of the first thin film transistor T1.

Referring to FIG. 5, at least another thin film transistors T2, T3, T4, T5, and T6 among the first to sixth thin film transistors T1, T2, T3, T4, T5, and T6 may include a gate electrode G, a second active layer ACT2 patterned by covering the gate electrode G with a second planar size, a source electrode SS formed to cover the gate electrode G and a partial area of the second active layer ACT2 overlapping the gate electrode G, and a drain electrode DD formed in a direction opposite to the source electrode SS to cover the gate electrode G and a partial area of the second active layer ACT2 overlapping the gate electrode G.

For example, the second active layer ACT2 of the third thin film transistor T3 may be formed to cover the gate electrode G extending from the second scan line GRL with a second planar size. The source electrode SS of the third thin film transistor T3 may be formed so that a side is electrically connected to a reference voltage supply line LVref, and another side covers a portion of the second active layer ACT2 overlapping the gate electrode G. Accordingly, the drain electrode DD of the third thin film transistor T3 may be formed so that a side covers the gate electrode G and a partial area of the second active layer ACT2 overlapping the gate electrode G, and another side is electrically connected to the first contact node Nd of the first thin film transistor T1. A first planar area of the first active layer ACT1 formed in at least one thin film transistor T2 may be greater or wider than a second planar area of the second active layer ACT2 formed in at least other thin film transistors T2, T3, T4, T5, and T6.

A thickness of the first active layer ACT1 formed in at least one thin film transistor T2 may be greater than a thickness of the second active layer ACT2 formed in at least other thin film transistors T2, T3, T4, T5, and T6.

A width of the first active layer ACT1 formed in at least one thin film transistor T2 in at least one direction may be greater than a width of the second active layer ACT2 formed in at least other thin film transistors T2, T3, T4, T5, and T6 in at least one direction.

Figure 6:
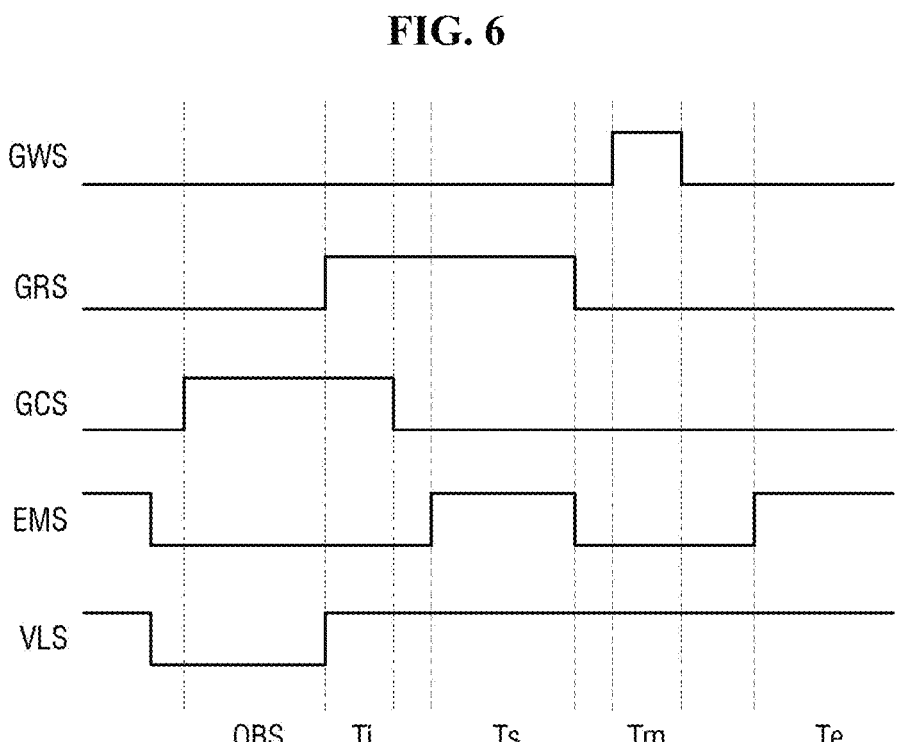
FIG. 6 is a schematic timing diagram illustrating changes in waveforms of pixel driving control signals according to an embodiment.

FIG. 6 is a schematic timing diagram illustrating changes in waveforms of pixel driving control signals according to an embodiment.

FIG. 6 schematically illustrates pixel driving control signals supplied to each pixel SP during a pixel row driving period in units of horizontal lines (or horizontal rows), for example, the first scan signal GWS, the second scan signal GRS, the initialization signal GCS, the enable signal EMS, and the emission control signal VLS.

Each pixel SP may be driven for each pixel row driving period according to the waveform and supply timing of the pixel driving control signals supplied for each pixel row driving period in units of horizontal lines. The pixel row driving period in units of horizontal lines may be classified into an on-bias stress period OBS, an initialization driving period Ti, a sampling period TS, a data writing period TM, and a light emission period Te. Accordingly, the pixels SP in units of horizontal lines may be sequentially driven for each pixel row driving period.

Figure 7:
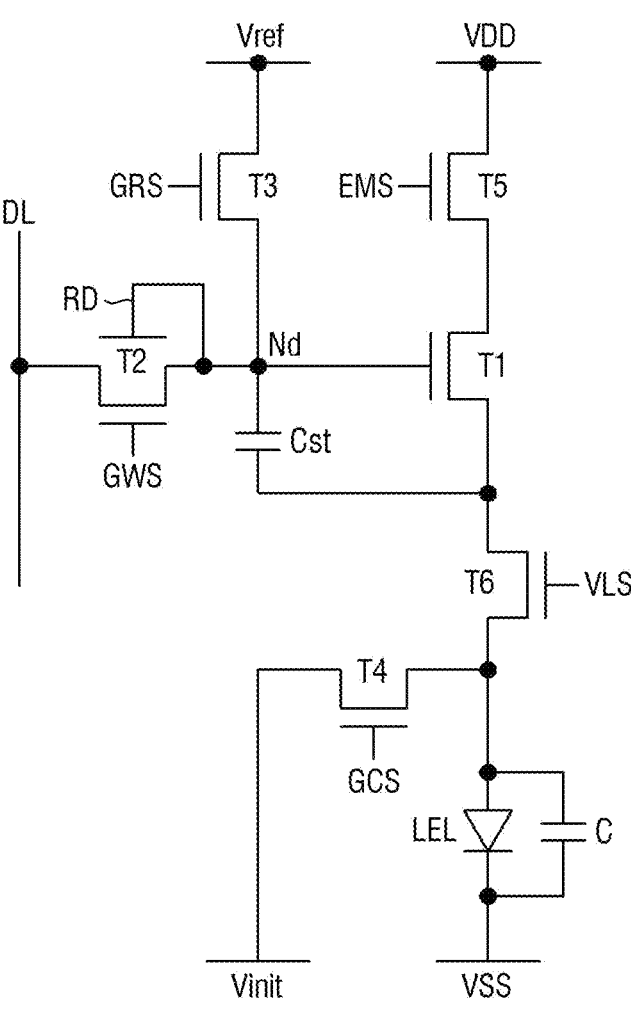
FIG. 7 is a schematic diagram of an equivalent circuit of a pixel of the display panel illustrated in FIG. 3 according to an embodiment.

FIG. 7 is a schematic diagram of an equivalent circuit of a pixel of the display panel illustrated in FIG. 3 according to an embodiment.

Referring to FIG. 7, at least one thin film transistor among the thin film transistors T1, T2, T3, T4, T5, and T6 for each pixel SP, for example, the second thin film transistor T2 may be formed in a diode structure or a self-bias structure in which the first active layer ACT1 and the drain electrode DD or source electrode SS are electrically connected. In other words, the active layer ACT1 of the second thin film transistor T2 may be electrically connected to the first contact node Nd of the second thin film transistor T2.

The second thin film transistor T2 may be formed in a diode structure or a self-bias structure in which the gate electrode G is electrically connected to the drain electrode DD or the source electrode SS. In other words, the gate electrode G of the second thin film transistor T2 may be electrically connected to the first contact node Nd of the second thin film transistor T2.

As a voltage level of the active layer ACT1 or the gate electrode G is maintained to be the same as a voltage level of the first contact node Nd, the second thin film transistor T2 formed in the diode structure or the self-bias structure may reduce a voltage drop of the active layer ACT1 due to changes in temperature.

Figure 8:
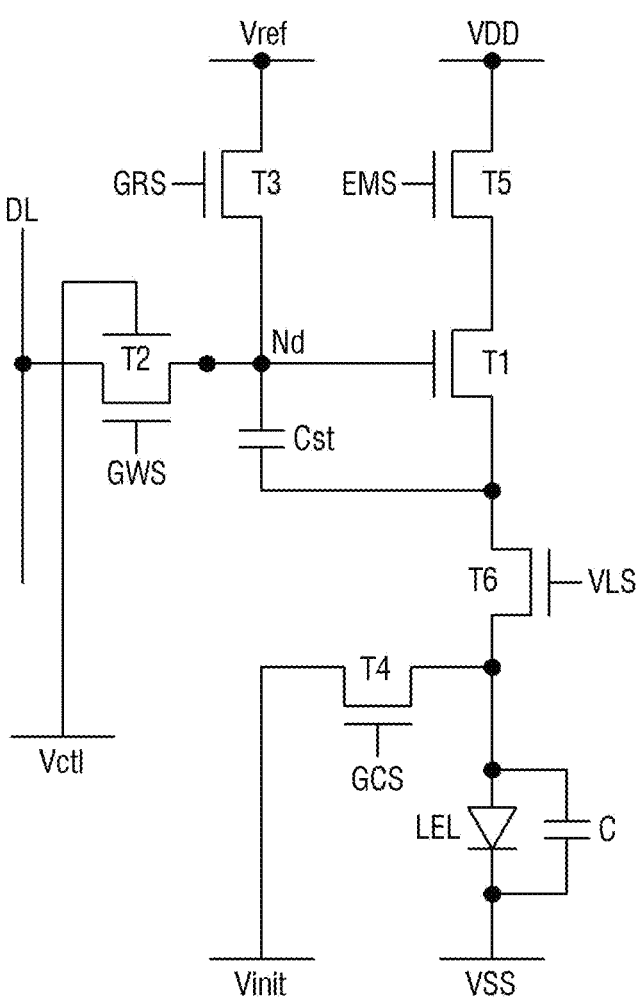
FIG. 8 is a schematic diagram of an equivalent circuit of a pixel of the display panel illustrated in FIG. 3 according to an embodiment.

FIG. 8 is a schematic diagram of an equivalent circuit of a pixel of the display panel illustrated in FIG. 3 according to an embodiment.

Referring to FIG. 8, the first active layer ACT1 of at least one thin film transistor among the thin film transistors T1, T2, T3, T4, T5, and T6 for each pixel SP, for example, the second thin film transistor T2 may be electrically connected to the display driving circuit 200 through the voltage control line.

The display driving circuit 200 may supply an active control voltage Vct1 to the first active layer ACT1 of the second thin film transistor T2 through the voltage control line.

The first active layer ACT1 of the second thin film transistor T2 may be supplied with the active control voltage Vct1 from the display driving circuit 200 in units of periods, and the voltage of the first active layer ACT1 may be maintained at a level of the active control voltage Vct1 in units of the periods. Accordingly, as the voltage of the active layer ACT1 of the second thin film transistor T2 is maintained at the level of the active control voltage Vct1 for each period, it is possible to prevent the voltage drop of the active layer ACT1 due to changes in temperature.

Figure 9:
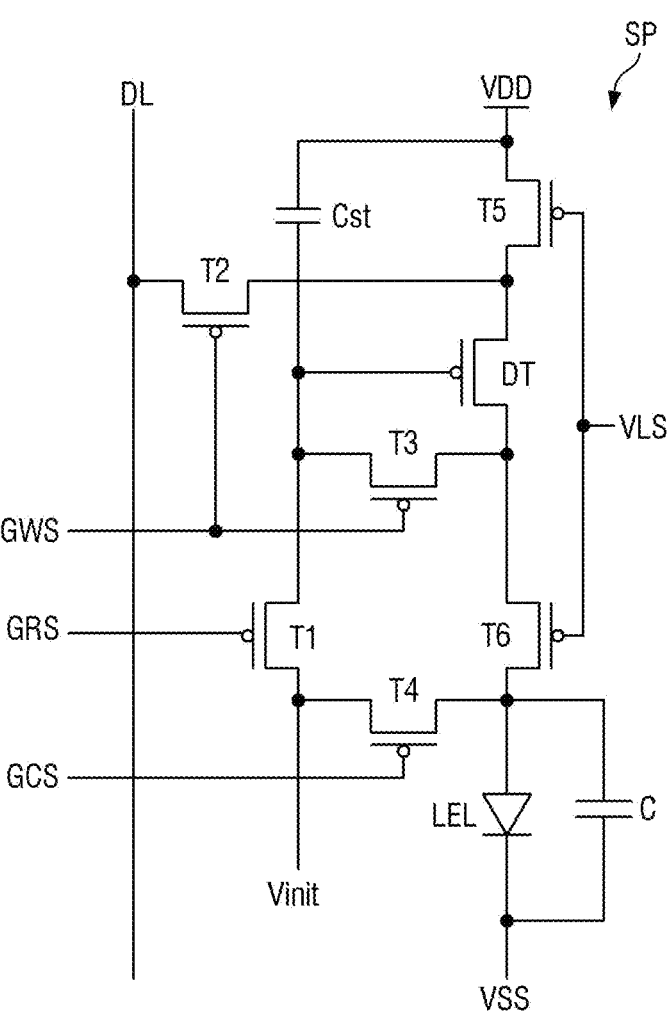
FIG. 9 is a schematic diagram of an equivalent circuit of a pixel of the display panel illustrated in FIG. 3 according to an embodiment.

FIG. 9 is a schematic diagram of an equivalent circuit of a pixel of the display panel illustrated in FIG. 3 according to an embodiment.

Referring to FIG. 9, each pixel SP may include a light emitting element LEL and a pixel circuit that controls an amount of light emitted from the light emitting element LEL, and the pixel circuit may be formed as a 7T2C type.

The pixel circuit of a 7T2C type may include a driving transistor DT and first to sixth thin film transistors T1, T2, T3, T4, T5, and T6. The first to sixth thin film transistors T1, T2, T3, T4, T5, and T6 and the driving transistor DT may be formed as P-type MOSFETs. In another embodiment, the first to sixth thin film transistors T1, T2, T3, T4, T5, and T6 and the driving transistor DT may be formed as N-type MOSFETs.

Figure 10:
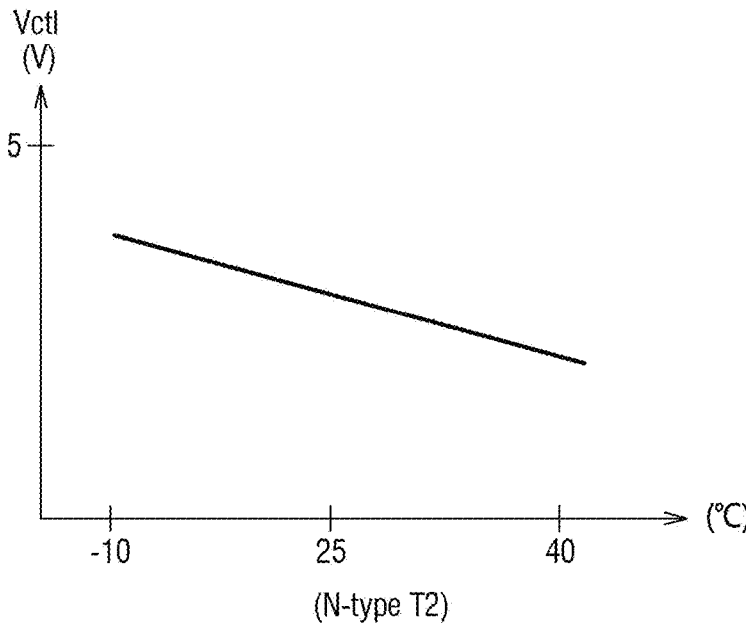
FIG. 10 is a graph illustrating a correlation between an active control voltage supplied to an active layer of a second thin film transistor illustrated in FIG. 8 and temperature according to an embodiment.

FIG. 10 is a graph illustrating a correlation between an active control voltage supplied to an active layer of a second thin film transistor illustrated in FIG. 8 and temperature according to an embodiment.

As illustrated in FIG. 8, at least one thin film transistor among the thin film transistors T1, T2, T3, T4, T5, and T6 for each pixel SP, for example, the second thin film transistor T2, may be formed as an N-type MOSFET.

The display driving circuit 200 may receive a temperature value or an external temperature value (or temperature data) of the display panel 100 in real time through a temperature detection sensor module formed on the display panel 100.

In case that the second thin film transistor T2 is formed as the N-type MOSFET, the display driving circuit 200 may vary a voltage level of the active control voltage Vct1 to be inversely proportional to a change in the magnitude of the temperature of the display panel 100 or the external temperature, and supply the active control voltage Vct1 whose voltage level is varied to the first active layer ACT1 of the second thin film transistor T2 through the voltage control line.

The display driving circuit 200 may minimize a change in the voltage level of the first active layer ACT1 of the second thin film transistor T2 in response to the change in temperature by increasing the active control voltage Vct1 as the temperature of the display panel 100 or the external temperature decreases and lowering the active control voltage Vct1 as the temperature of the display panel 100 or the external temperature increases.

Figure 11:
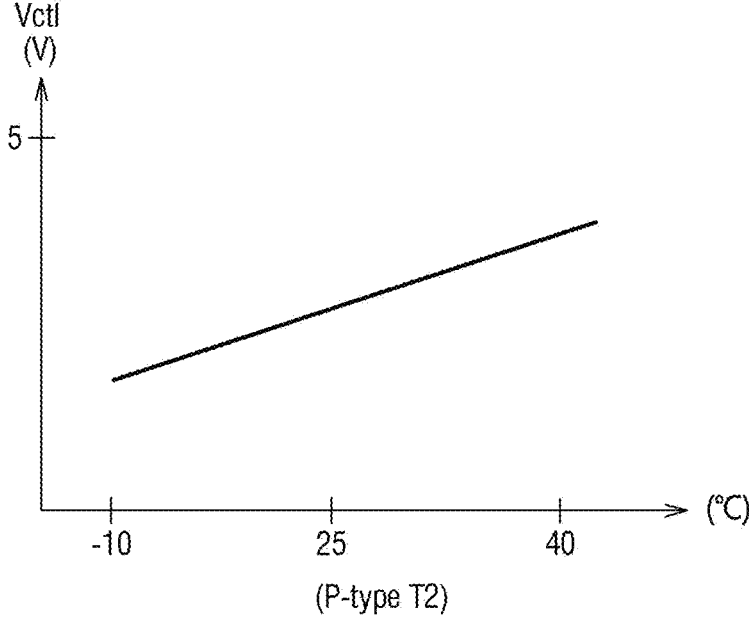
FIG. 11 is a graph of illustrating a correlation between an active control voltage supplied to an active layer of a second thin film transistor illustrated in FIG. 9 and temperature according to an embodiment.

FIG. 11 is a graph illustrating a correlation between an active control voltage supplied to an active layer of a second thin film transistor illustrated in FIG. 9 and temperature according to an embodiment.

As illustrated in FIG. 9, at least one thin film transistor among the thin film transistors T1, T2, T3, T4, T5, and T6 for each pixel SP, for example, the second thin film transistor T2, may be formed as a P-type MOSFET.

In case that the second thin film transistor T2 is formed as the P-type MOSFET, the display driving circuit 200 may vary a voltage level of the active control voltage Vct1 to be proportional to a change in the magnitude of the temperature of the display panel 100 or the external temperature, and supply the active control voltage Vct1 whose voltage level is varied to the first active layer ACT1 of the second thin film transistor T2 through the voltage control line.

The display driving circuit 200 may minimize a change in the voltage level of the first active layer ACT1 of the second thin film transistor T2 in response to the change in temperature by lowering the active control voltage Vct1 as the temperature of the display panel 100 or the external temperature decreases and increasing the active control voltage Vct1 as the temperature of the display panel 100 or the external temperature increases.

Figure 12:
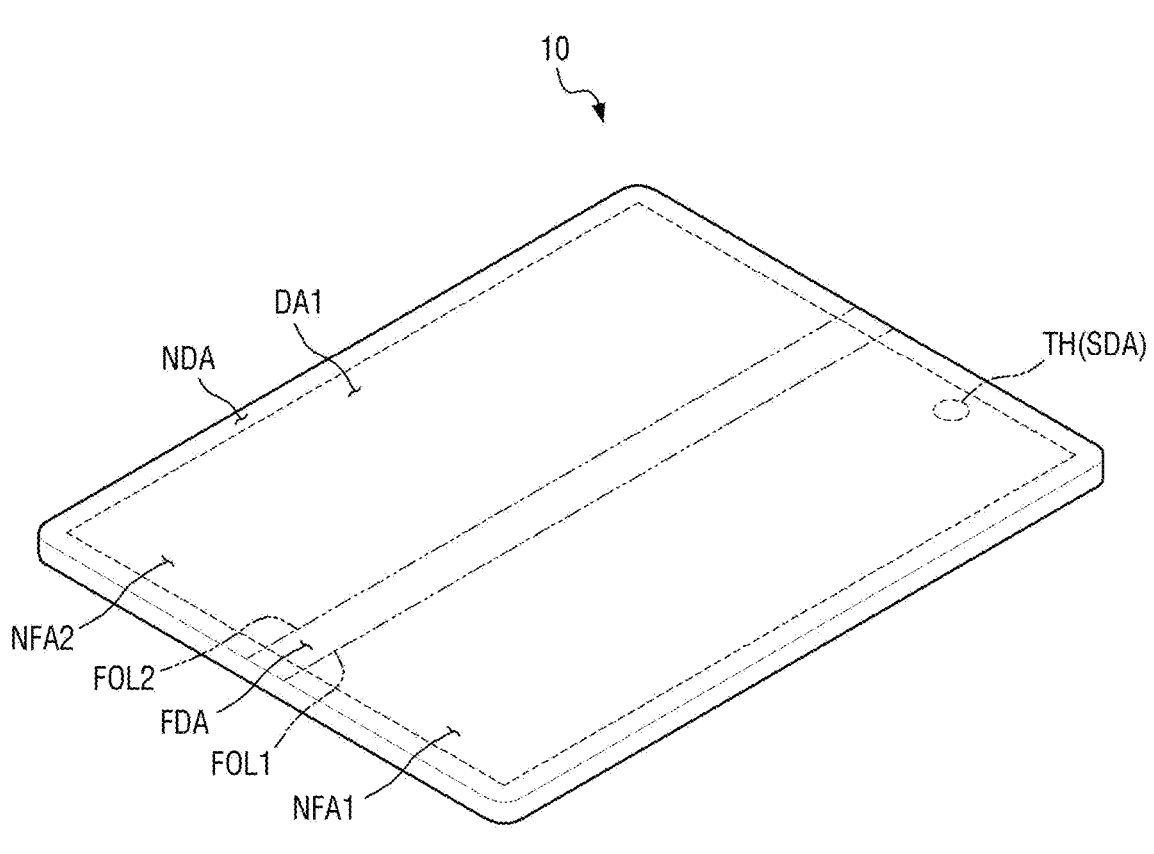
FIGS. 12 and 13 are perspective views illustrating application of the display device according to an embodiment of the disclosure.
Figure 12:
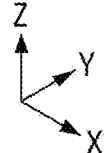
Figure 13:
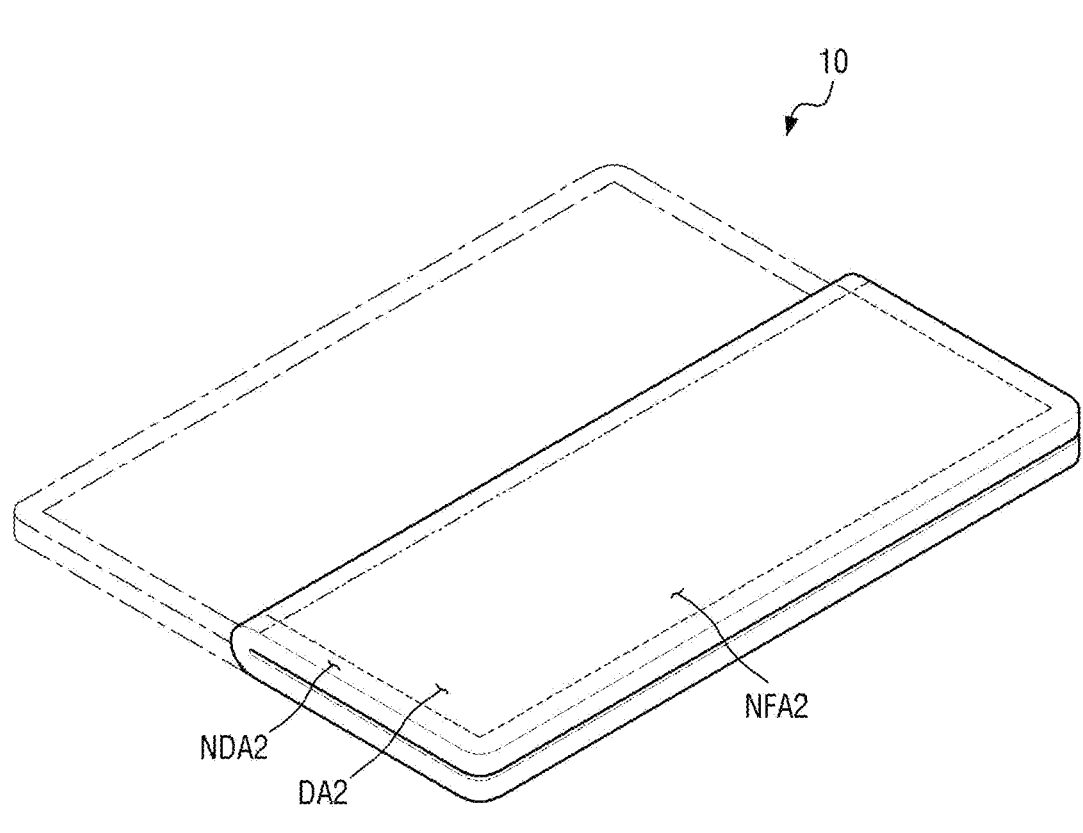
Figure 13:

FIGS. 12 and 13 are perspective views illustrating application of the display device according to an embodiment of the disclosure.

FIGS. 12 and 13 illustrate an embodiment in which the display device 10 is a foldable display device that is foldable in the first direction (X-axis direction). The display device 10 may maintain both a folded state and an unfolded state. The display device 10 may be foldable in an in-folding manner in which a front surface is disposed on an inner side. In case that the display device 10 may be bent or folded in the in-folding manner, the front surfaces of the display device 10 may face each other. In another embodiment, the display device 10 may be folded in an out-folding manner in which the front surface is disposed on an outer side. In case that the display device 10 is bent or folded in the out-folding manner, rear surfaces of the display device 10 may be disposed to face each other.

A first non-folding area NFA1 may be disposed on a side of a folding area FDA, for example, a right side. A second non-folding area NFA2 may be disposed on another side of the folding area FDA, for example, a left side. The touch sensing unit TSU according to the embodiment of the disclosure may be formed and disposed on the first non-folding area NFA1 and the second non-folding area NFA2, respectively.

A first folding line FOL1 and a second folding line FOL2 may extend in the second direction (Y-axis direction), and the display device 10 may be foldable in the first direction (X-axis direction). Accordingly, since a length of the display device 10 in the first direction (X-axis direction) may be reduced by about half, it may be convenient for the user to carry the display device 10.

The extending direction of the first folding line FOL1 and the extending direction of the second folding line FOL2 are not limited to the second direction (Y-axis direction). For example, the first folding line FOL1 and the second folding line FOL2 may extend in the first direction (X-axis direction), the display device 10 may be folded in the second direction (Y-axis direction), and a length of the display device 10 in the second direction (the Y-axis direction) may be reduced by about half. In another embodiment, the first folding line FOL1 and the second folding line FOL2 may extend in a diagonal direction between the first direction (X-axis direction) and the second direction (Y-axis direction) of the display device 10, and the display device 10 may be folded in a triangular shape.

In case that the first folding line FOL1 and the second folding line FOL2 extend in the second direction (Y-axis direction), a length of the folding area FDA in the first direction (X-axis direction) may be less than a length thereof in the second direction (Y-axis direction). A length of the first non-folding area NFA1 in the first direction (X-axis direction) may be greater than the length of the folding area FDA in the first direction (X-axis direction). A length of the second non-folding area NFA2 in the first direction (X-axis direction) may be greater than the length of the folding area FDA in the first direction (X-axis direction).

A first display area DA1 may be disposed on the front surface of the display device 10. The first display area DA1 may overlap the folding area FDA, the first non-folding area NFA1, and the second non-folding area NFA2 in the thickness direction. Therefore, in case that the display device 10 is unfolded, an image may be displayed in a front direction in the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2 in the thickness direction. Therefore, in case that the display device 10 is folded, an image may be displayed in the front direction in the second non-folding area NFA2 of the display device 10.

FIGS. 12 and 13 illustrate that a through hole TH in which a camera SDA is formed is disposed in the first non-folding area NFA1, but the disclosure is not limited thereto. The through hole TH or the camera SDA may be disposed in the second non-folding area NFA2 or the folding area FDA.

Figure 14:
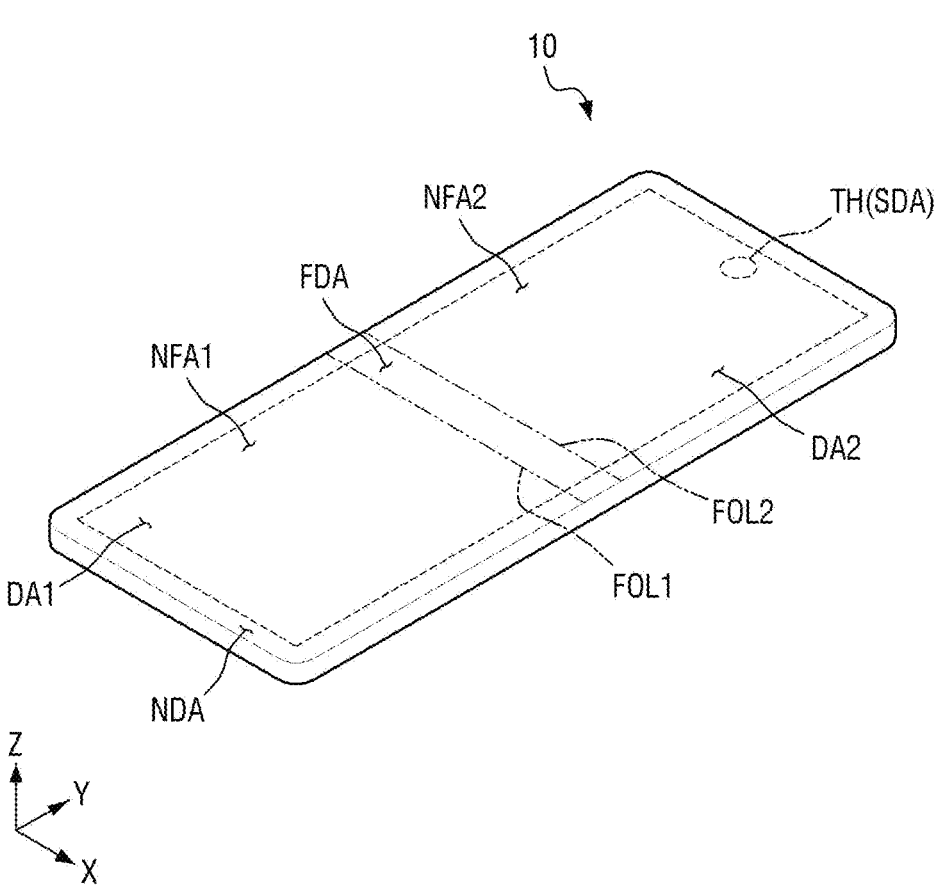
FIGS. 14 and 15 are perspective views illustrating application of a display device according to another embodiment of the disclosure.
Figure 15:
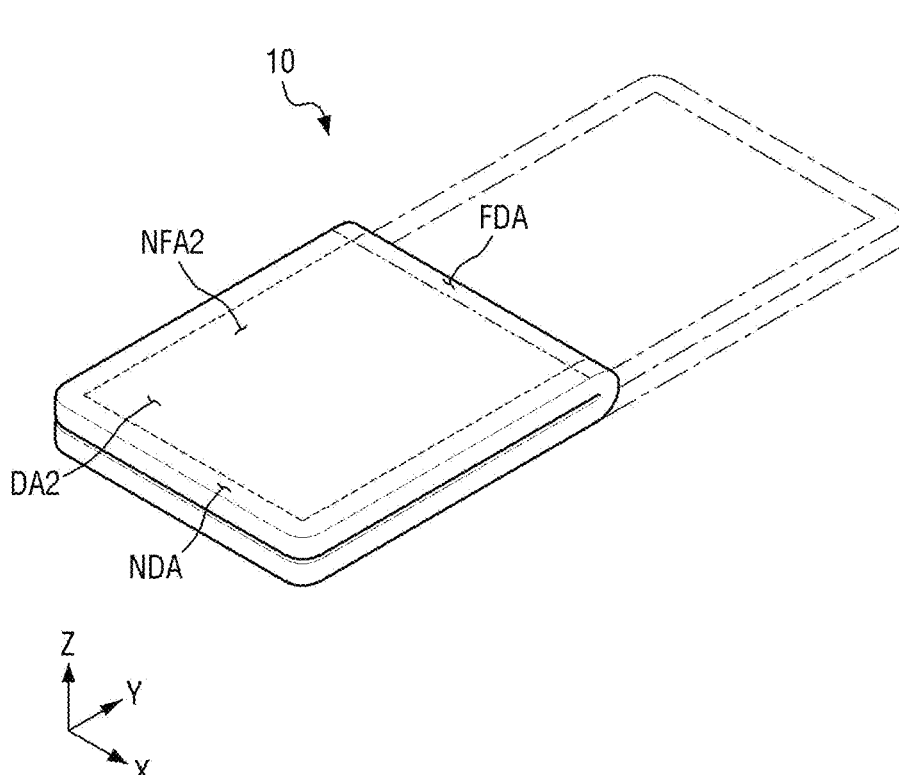

FIGS. 14 and 15 are perspective views illustrating application of a display device according to another embodiment of the disclosure.

FIGS. 14 and 15 schematically illustrate an embodiment in which the display device 10 is a foldable display device that is foldable in the second direction (Y-axis direction). The display device 10 may maintain both a folded state and an unfolded state. The display device 10 may be folded in an in-folding manner in which a front surface is disposed on an inner side. In case that the display device 10 is bent or folded in the in-folding manner, the front surfaces of the display device 10 may be disposed to face each other. In another embodiment, the display device 10 may be foldable in an out-folding manner in which the front surface is disposed on an outer side. In case that the display device 10 is bent or folded in the out-folding manner, rear surfaces of the display device 10 may be disposed to face each other.

The display device 10 may include a folding area FDA, a first non-folding area NFA1, and a second non-folding area NFA2. The folding area FDA may be an area in which the display device 10 is foldable, and the first non-folding area NFA1 and the second non-folding area NFA2 may be areas in which the display device 10 is not foldable. The first non-folding area NFA1 may be disposed on a side of the folding area FDA, for example, a lower side. The second non-folding area NFA2 may be disposed on another side of the folding area FDA, for example, an upper side.

The touch sensing unit TSU according to the embodiment of the disclosure may be formed and disposed on the first non-folding area NFA1 and the second non-folding area NFA2, respectively.

On the other hand, the folding area FDA may be an area foldable with a curvature at the first folding line FOL1 and the second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

As illustrated in FIGS. 14 and 15, the first folding line FOL1 and the second folding line FOL2 may extend in the first direction (X-axis direction), and the display device 10 may be foldable in the second direction (Y-axis direction). Accordingly, since a length of the display device 10 in the second direction (Y-axis direction) may be reduced by about half, it may be convenient for a user to carry the display device 10.

The extending direction of the first folding line FOL1 and the extending direction of the second folding line FOL2 are not limited to the first direction (X-axis direction). For example, the first folding line FOL1 and the second folding line FOL2 may extend in the second direction (Y-axis direction), the display device 10 may be foldable in the first direction (X-axis direction), and a length of the display device 10 in the first direction (the X-axis direction) may be reduced by about half. In another embodiment, the first folding line FOL1 and the second folding line FOL2 may extend in a diagonal direction between the first direction (X-axis direction) and the second direction (Y-axis direction) of the display device 10, and the display device 10 may be foldable in a triangular shape.

In case that the first folding line FOL1 and the second folding line FOL2 extend in the first direction (X-axis direction) as illustrated in FIGS. 14 and 15, a length of the folding area FDA in the second direction (Y-axis direction) may be less than a length thereof in the first direction (X-axis direction). A length of the first non-folding area NFA1 in the second direction (Y-axis direction) may be greater than the length of the folding area FDA in the second direction (Y-axis direction). A length of the second non-folding area NFA2 in the second direction (Y-axis direction) may be greater than the length of the folding area FDA in the second direction (Y-axis direction).

A first display area DA1 may be disposed on the front surface of the display device 10. The first display area DA1 may overlap the folding area FDA, the first non-folding area NFA1, and the second non-folding area NFA2 in the thickness direction. Therefore, in case that the display device 10 is unfolded, an image may be displayed in a front direction in the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2 in the thickness direction. Therefore, in case that the display device 10 is folded, an image may be displayed in the front direction in the second non-folding area NFA2 of the display device 10.

FIGS. 14 and 15 schematically illustrate that a through hole TH in which a camera SDA is disposed is disposed in the second non-folding area NFA2, but the disclosure is not limited thereto. The through hole TH may be disposed in the first non-folding area NFA1 or the folding area FDA.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a plurality of pixels arranged in a display area of a display panel; and
   a display driving circuit supplying data voltages and pixel driving control signals to the plurality of pixels to control an image display operation for each of the plurality of pixels,
   wherein the display driving circuit further supplies an active control voltage that varies proportional to or inversely proportional to a change in temperature of the display panel to at least one thin film transistor included in the plurality of pixels.

2. The display device of claim 1, wherein
the plurality of pixels include a light emitting element and a pixel circuit that controls an amount of light emitted from the light emitting element,
the pixel circuit includes a plurality of thin film transistors and at least one capacitor, and
at least one of the plurality of thin film transistors includes:
    a gate electrode;
    a first active layer having a first planar size;
    a source electrode formed on a side of the first active layer and covering the gate electrode and a partial area of the first active layer overlapping the gate electrode in a thickness direction of the display panel; and
    a drain electrode formed on another side of the first active layer opposite to the source electrode and covering the gate electrode and another partial area of the first active layer overlapping the gate electrode in the thickness direction.

3. The display device of claim 2, wherein at least another one of the plurality of thin film transistors includes:
    a gate electrode;
    a second active layer having a second planar size;
    a source electrode formed on a side of the second active layer and covering the gate electrode and a partial area of the second active layer overlapping the gate electrode in the thickness direction; and
    a drain electrode formed on another side of the second active layer opposite to the source electrode and covering the gate electrode and another partial area of the second active layer overlapping the gate electrode in the thickness direction.

4. The display device of claim 3, wherein a first planar area of the first active layer is greater than a second planar area of the second active layer in a plan view.

5. The display device of claim 3, wherein a height or thickness of the first active layer is greater than a height or thickness of the second active layer.

6. The display device of claim 3, wherein a width of the first active layer in at least one direction is greater than a width of the second active layer in the at least one direction.

7. The display device of claim 2, wherein the at least one of the plurality of thin film transistors is supplied with the active control voltage from the display driving circuit in predetermined time intervals, as the first active layer is electrically connected to the display driving circuit through a voltage control line.

8. The display device of claim 7, wherein the display driving circuit varies a voltage level of the active control voltage to be proportional or inversely proportional to a change in magnitude of temperature of the display panel or external temperature, and supplies the active control voltage, whose voltage level is varied, to the first active layer of the at least one of the plurality of thin film transistors through the voltage control line.

9. A display device comprising:
    a plurality of pixels arranged in a display area of a display panel;
    a touch sensing part mounted on a front portion of the display panel or formed integrally with the display panel;

a touch driving circuit sensing a touch of a human body or a touch pen using a plurality of touch electrodes arranged in the touch sensing part; and
    a display driving circuit supplying data voltages and pixel driving control signals to the plurality of pixels to control an image display operation for each of the plurality of pixels,
    wherein the display driving circuit further supplies an active control voltage that varies proportional or inversely proportional to a change in temperature of the display panel to at least one thin film transistor included in the plurality of pixels.

10. The display device of claim 9, wherein
the plurality of pixels include a light emitting element and a pixel circuit that controls an amount of light emitted from the light emitting element,
the pixel circuit includes a plurality of thin film transistors and at least one capacitor, and
at least one of the plurality of thin film transistors includes:
    a gate electrode;
    a first active layer having a first planar size;
    a source electrode formed on a side of the first active layer and covering the gate electrode and a partial area of the first active layer overlapping the gate electrode in a thickness direction of the display panel; and
    a drain electrode formed on another side of the first active layer opposite to the source electrode and covering the gate electrode and another partial area of the first active layer overlapping the gate electrode in the thickness direction.

11. The display device of claim 10, wherein at least another one of the plurality of thin film transistors includes:
    a gate electrode;
    a second active layer having a second planar size;
    a source electrode formed on a side of the second active layer and covering the gate electrode and a partial area of the second active layer overlapping the gate electrode in the thickness direction; and
    a drain electrode formed on another side of the second active layer opposite to the source electrode and covering the gate electrode and another partial area of the second active layer overlapping the gate electrode in the thickness direction.

12. The display device of claim 11, wherein
a first planar area of the first active layer is greater than a second planar area of the second active layer in a plan view, or
a height of the first active layer is greater than a height of the second active layer, or
a width of the first active layer in at least one direction is greater than a width of the second active layer in the at least one direction.

13. The display device of claim 10, wherein the at least one of the plurality of thin film transistors is supplied with the active control voltage from the display driving circuit in predetermined time intervals, as the first active layer is electrically connected to the display driving circuit through a voltage control line.

14. The display device of claim 13, wherein the display driving circuit varies a voltage level of the active control voltage to be proportional to or inversely proportional to a change in magnitude of temperature of the display panel or external temperature, and supplies the active control voltage, whose voltage level is varied, to the first active layer of the at least one of the plurality of thin film transistors through the voltage control line.

15. An electronic device including a display device, the display device comprising:

a plurality of pixels arranged in a display area of a display panel; and a display driving circuit supplying data voltages and pixel driving control signals to the plurality of pixels to control an image display operation for each of the plurality of pixels, wherein the display driving circuit further supplies an active control voltage that varies proportional to or inversely proportional to a change in temperature of the display panel to at least one thin film transistor included in the plurality of pixels.

\* \* \* \* \*